US010893611B2

(12) United States Patent
Tsuchida et al.

(10) Patent No.: US 10,893,611 B2
(45) Date of Patent: Jan. 12, 2021

(54) CIRCUIT ASSEMBLY AND ELECTRICAL JUNCTION BOX

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Toshiyuki Tsuchida, Mie (JP); Shigeki Yamane, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 16/611,522

(22) PCT Filed: Apr. 25, 2018

(86) PCT No.: PCT/JP2018/016717
§ 371 (c)(1),
(2) Date: Nov. 7, 2019

(87) PCT Pub. No.: WO2018/207621
PCT Pub. Date: Nov. 15, 2018

(65) Prior Publication Data
US 2020/0120803 A1   Apr. 16, 2020

(30) Foreign Application Priority Data

May 11, 2017 (JP) .................................. 2017-094551

(51) Int. Cl.
*H05K 7/14* (2006.01)
*H05K 1/18* (2006.01)
(Continued)

(52) U.S. Cl.
CPC ............. *H05K 1/181* (2013.01); *H02G 3/081* (2013.01); *H05K 1/0203* (2013.01); *H05K 5/03* (2013.01);
(Continued)

(58) Field of Classification Search
CPC ......................... B60R 16/0239; H05K 7/1427
See application file for complete search history.

(56) References Cited

U.S. PATENT DOCUMENTS 10,368,465 B2 * 7/2019 Aragones Carrete .......................
                                                  H01R 9/2458
2019/0123539 A1 * 4/2019 Tahara ................. H05K 5/0043

FOREIGN PATENT DOCUMENTS

JP      S52134066 U    10/1977
JP      H11-041749 A    2/1999
(Continued)

OTHER PUBLICATIONS

International Search Report, Application No. PCT/JP2018/016717, dated Jul. 31, 2018.

*Primary Examiner* — Hung V Ngo
(74) *Attorney, Agent, or Firm* — Honigman LLP

(57) ABSTRACT

A circuit assembly includes: a substrate with an electrically conducting path; plate-shaped busbars that have connection portions connected to the electrically conducting path of the substrate, and are arranged in an orientation in which plate surfaces thereof intersects with a surface of the substrate; a heat discharge member that is laid on a side of the substrate opposite to the busbars, and is configured to discharge heat of the substrate; and a resin frame that extends along the busbars, and holds the busbars while being in intimate contact with the busbars, wherein the frame includes mounting portions mounted on at least either the substrate or the heat discharge member.

11 Claims, 10 Drawing Sheets

(51) Int. Cl.
    *H02G 3/08*    (2006.01)
    *H05K 1/02*    (2006.01)
    *H05K 5/03*    (2006.01)
(52) U.S. Cl.
    CPC . *H05K 7/1427* (2013.01); *H05K 2201/10272* (2013.01)

(56) References Cited

FOREIGN PATENT DOCUMENTS

| | | |
|---|---|---|
| JP | 2000-003740 A | 1/2000 |
| JP | 2008-125190 A | 5/2008 |
| JP | 2014-011929 A | 1/2014 |
| JP | 5679959 B2 | 3/2015 |
| JP | 2016-184990 A | 10/2016 |

* cited by examiner

CIRCUIT ASSEMBLY AND ELECTRICAL JUNCTION BOX

CROSS-REFERENCE TO RELATED APPLICATIONS

This application is the U.S. national stage of PCT/JP2018/016717 filed on Apr. 25, 2018, which claims priority of Japanese Patent Application No. JP 2017-094551 filed on May 11, 2017, the contents of which are incorporated herein.

TECHNICAL FIELD

The present description discloses a technology relating to a circuit assembly and an electrical junction box.

BACKGROUND

Conventionally, a technique for connecting a busbar to an electrically conducting path of a printed wiring board is known. JP 5679959B discloses a wire auxiliary member in which a body portion extending in the longitudinal direction has, in a left side portion thereof, a plurality of lead portions, the plurality of lead portions being inserted into through holes formed in a printed wiring board and being soldered thereto. The plurality of lead portions include a tapered lead portion, and, if this tapered lead portion is inserted into the corresponding through hole, the corner of the lead portion will be brought into internal contact with and fitted to the through hole, so that the wire auxiliary member mechanically stands alone with respect to the printed wiring board. Furthermore, a plurality of short projections that are shorter than the lead portions are provided between the plurality of lead portions, and are retained in a state of being in contact with the printed wiring board.

Meanwhile, in JP 5679959B, the position of the wire auxiliary member with respect to the printed wiring board is kept using the lead portions and the projections provided on the wire auxiliary member, and thus, if the wire auxiliary member is subject to vibration, the portions of the wire auxiliary member soldered in the through holes of the printed wiring board will be subjected to stress, causing the concern that connection reliability of the soldered connection between the wire auxiliary member and the printed wiring board may be reduced.

The technique disclosed in the present description was made in the above-described circumferences, and it is an object thereof to suppress a reduction in connection reliability of a connection between an electrically conducting path of a substrate and a busbar.

SUMMARY

A circuit assembly disclosed in the present description includes: a substrate with an electrically conducting path; a plate-shaped busbar that has a connection portion connected to the electrically conducting path of the substrate, and is arranged in an orientation in which a plate surface of the plate-shaped busbar intersects with a surface of the substrate; a heat discharge member that is laid on a side of the substrate opposite to the busbar, and is configured to discharge heat of the substrate; and a resin frame that extends along the busbar, and holds the busbar while being in intimate contact with the busbar, wherein the frame includes a mounting portion mounted on at least either the substrate or the heat discharge member.

With this configuration, since the busbar is held by the frame, and the mounting portion of the frame is mounted on the substrate, stress due to vibration of the vehicle or the like is less likely to affect the connection portion of the busbar. Accordingly, it is possible to suppress a reduction in connection reliability of a connection between the electrically conducting path of the substrate and the busbar.

Furthermore, the plate surface of the busbar is arranged in an orientation in which it intersects with the surface of the substrate, and thus it is possible to reduce the area of the substrate covered by the busbar. This allows an enlarged area of the substrate on which electronic components can be mounted, making it possible to achieve a downsized circuit assembly.

Furthermore, heat of the busbar can be discharged from the frame to the outside, and thus it is possible to improve the discharge properties.

The following aspects are preferable as embodiments of the technique disclosed in the present description.

The frame may include an outer frame portion that is arranged along a rim portion of the heat discharge member, and the busbar may be held by the outer frame portion.

With this, heat of the busbar can be discharged from the outer frame portion to the outside.

The substrate may be a printed wiring board, and the printed wiring board may be laid on the heat discharge member.

With this, it is possible to directly transfer heat of the printed wiring board to the heat discharge member, compared to a configuration in which the busbar is arranged between the printed wiring board and the heat discharge member.

The mounting portion may be mounted on the substrate, and may have a fastening portion that is fastened, with a screw, to the substrate.

With this, the configuration of the mounting portion can be used to fasten, with a screw, the substrate to the heat discharge member.

The busbar may have a terminal portion that is connectable to an external terminal, and the frame may include a resting portion on which the terminal portion is placed.

With this, the frame can absorb a torque occurring when connecting an external terminal to the terminal portion.

The terminal portion may have a plate surface that extends along the surface of the substrate, and the resting portion may be arranged between the terminal portion and the substrate.

With this, the terminal portion can be arranged in a region above the substrate, thus making it possible to realize a downsized circuit assembly, compared to a configuration in which the terminal portion is arranged outside the region of the substrate.

An electrical junction box is provided that includes the circuit assembly, and a cover that covers the circuit assembly.

Advantageous Effects of Invention

According to the technique disclosed in the present description, it is possible to suppress a reduction in connection reliability of a connection between an electrically conducting path of a substrate, and a busbar.

DETAILED DESCRIPTION OF PREFERRED EMBODIMENTS

Embodiment 1

Embodiment 1 will be described with reference to FIGS. 1 to 6.

Figure 1:
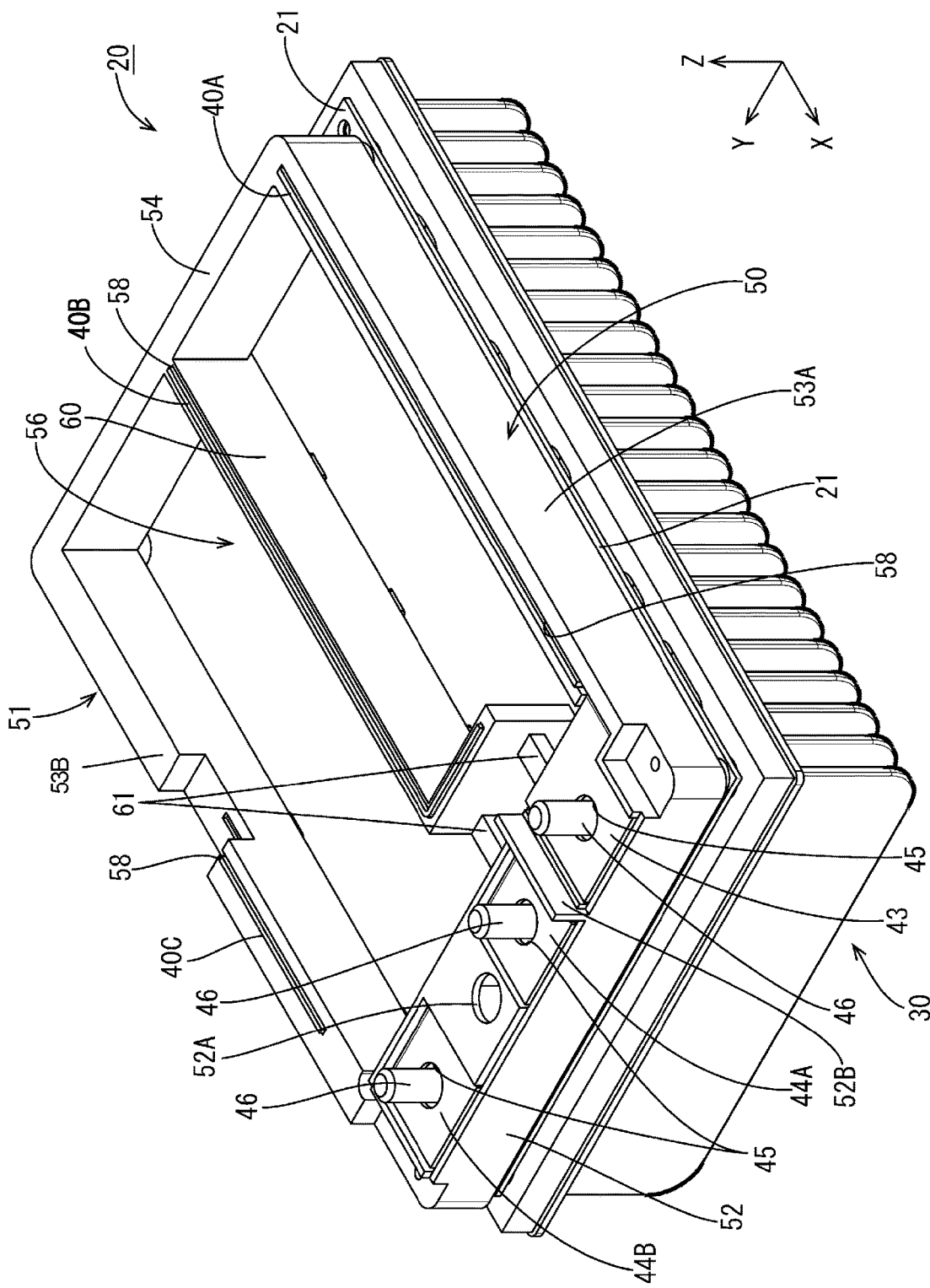
FIG. 1 is a perspective view illustrating a circuit assembly according to Embodiment 1.
Figure 2:
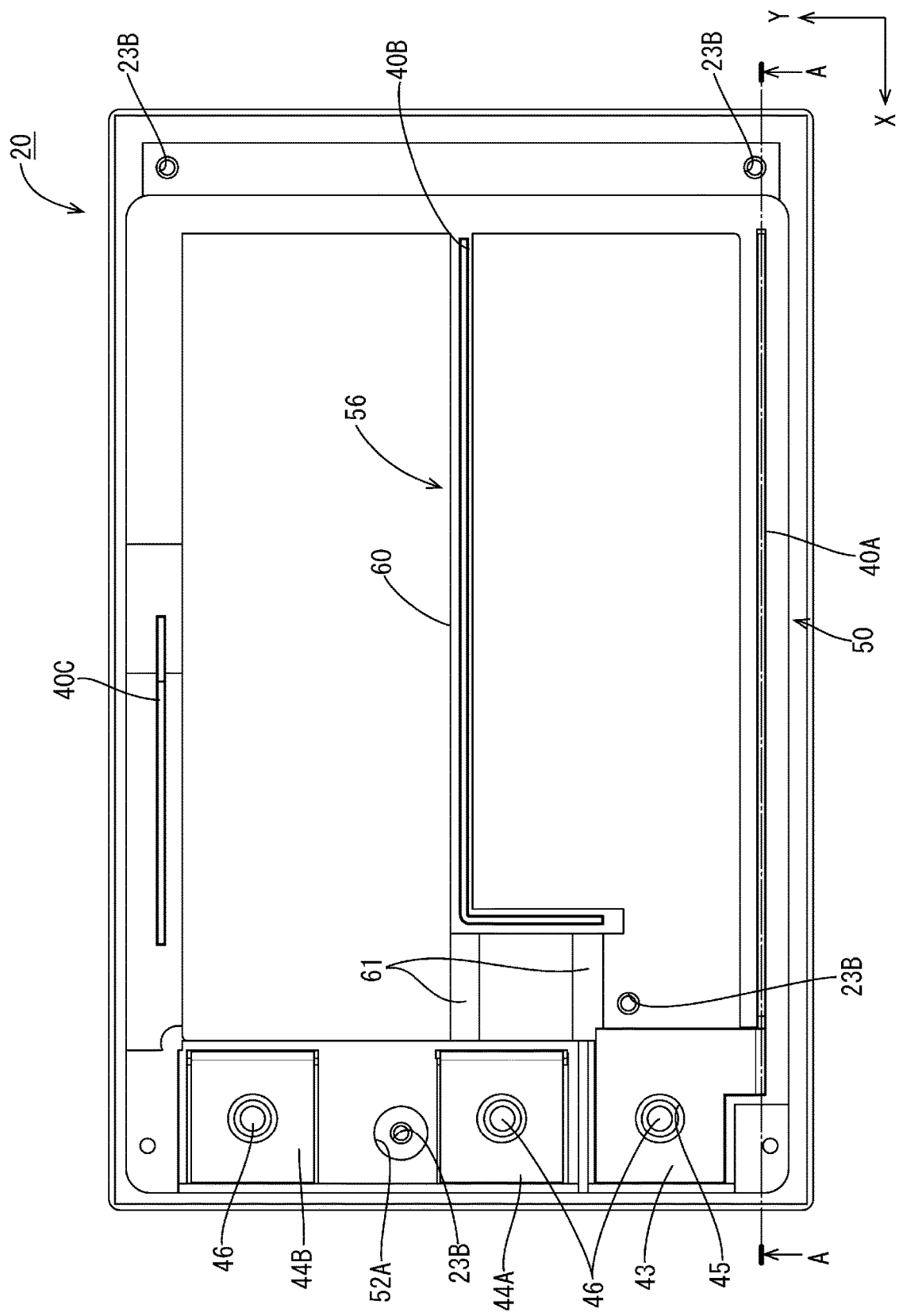
FIG. 2 is a plan view illustrating the circuit assembly.
Figure 3:
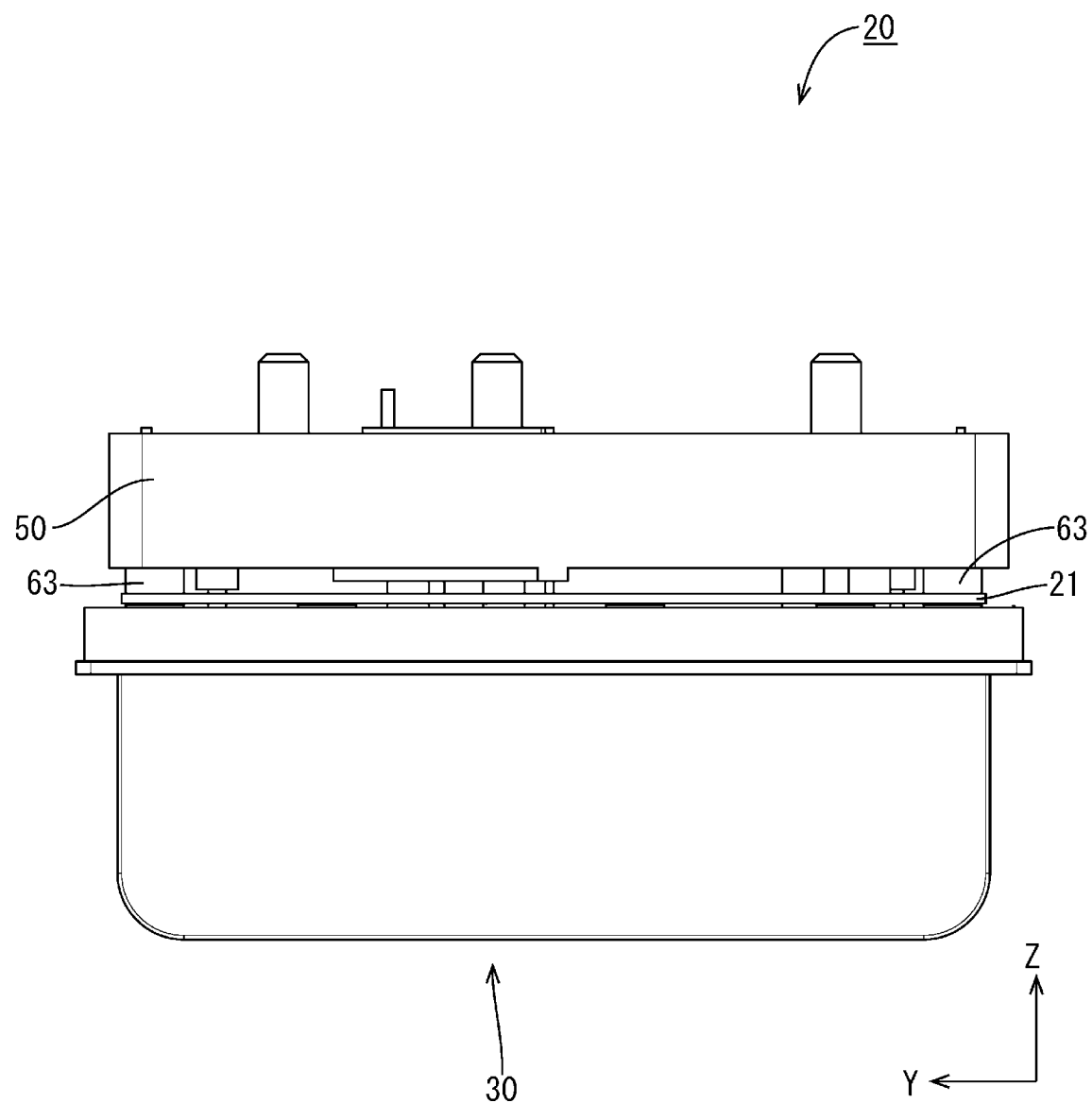
FIG. 3 is a front view illustrating the circuit assembly.
Figure 4:
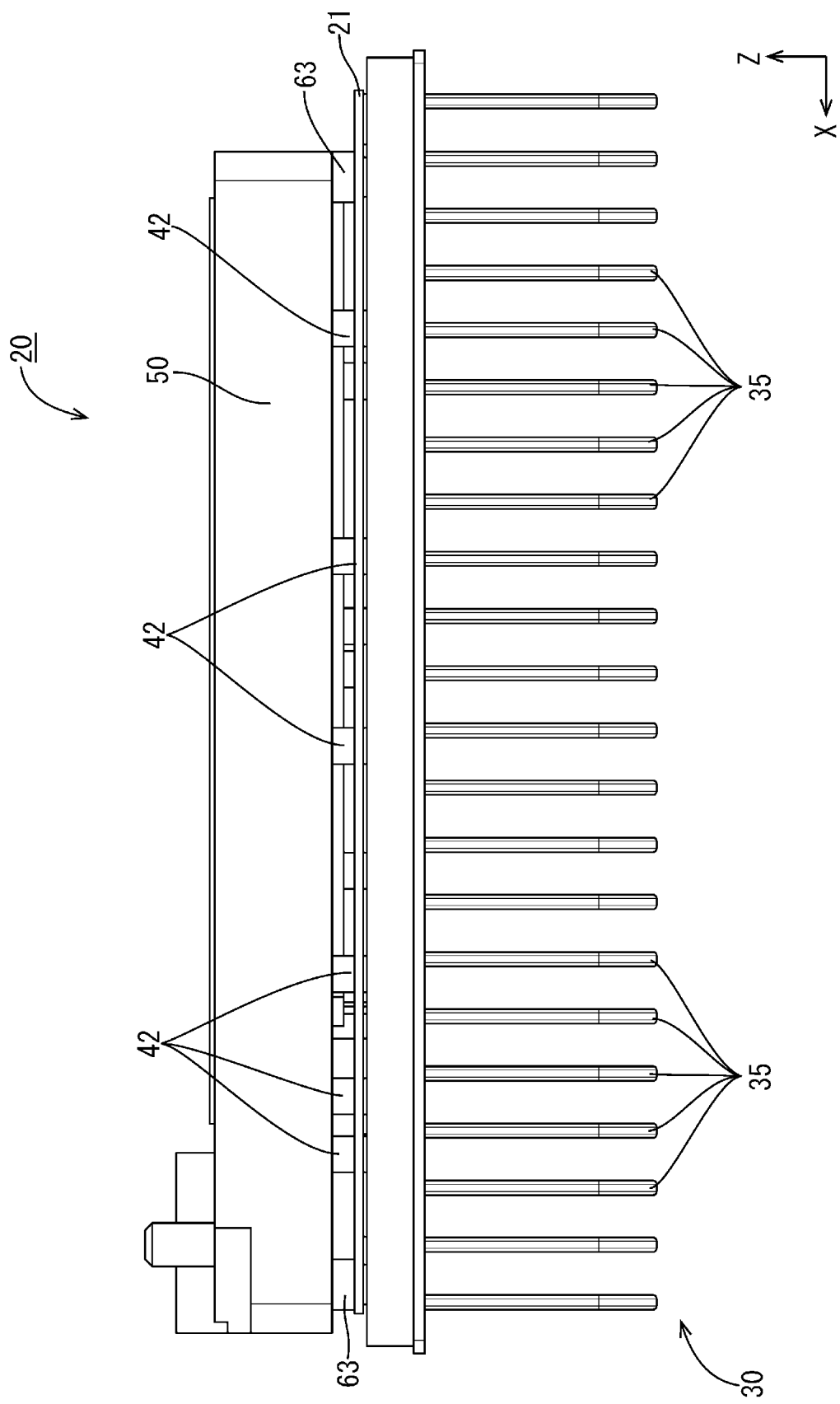
FIG. 4 is a side view illustrating the circuit assembly.

An electrical junction box 10 is arranged on an electric power supply path of a vehicle such as, for example, an electric automobile or a hybrid automobile, the electric power supply path extending between a power supply such as a battery, and loads including an on-board electric component such as a lamp, a motor, and the like. The electrical junction box 10 can be used for a DC-DC converter, an inverter, or the like, for example. Hereinafter, description will be given assuming that "X" direction in FIG. 1 is frontward, "Y" direction is leftward, and "Z" direction is upward.

Electrical Junction Box 10

Figure 5:
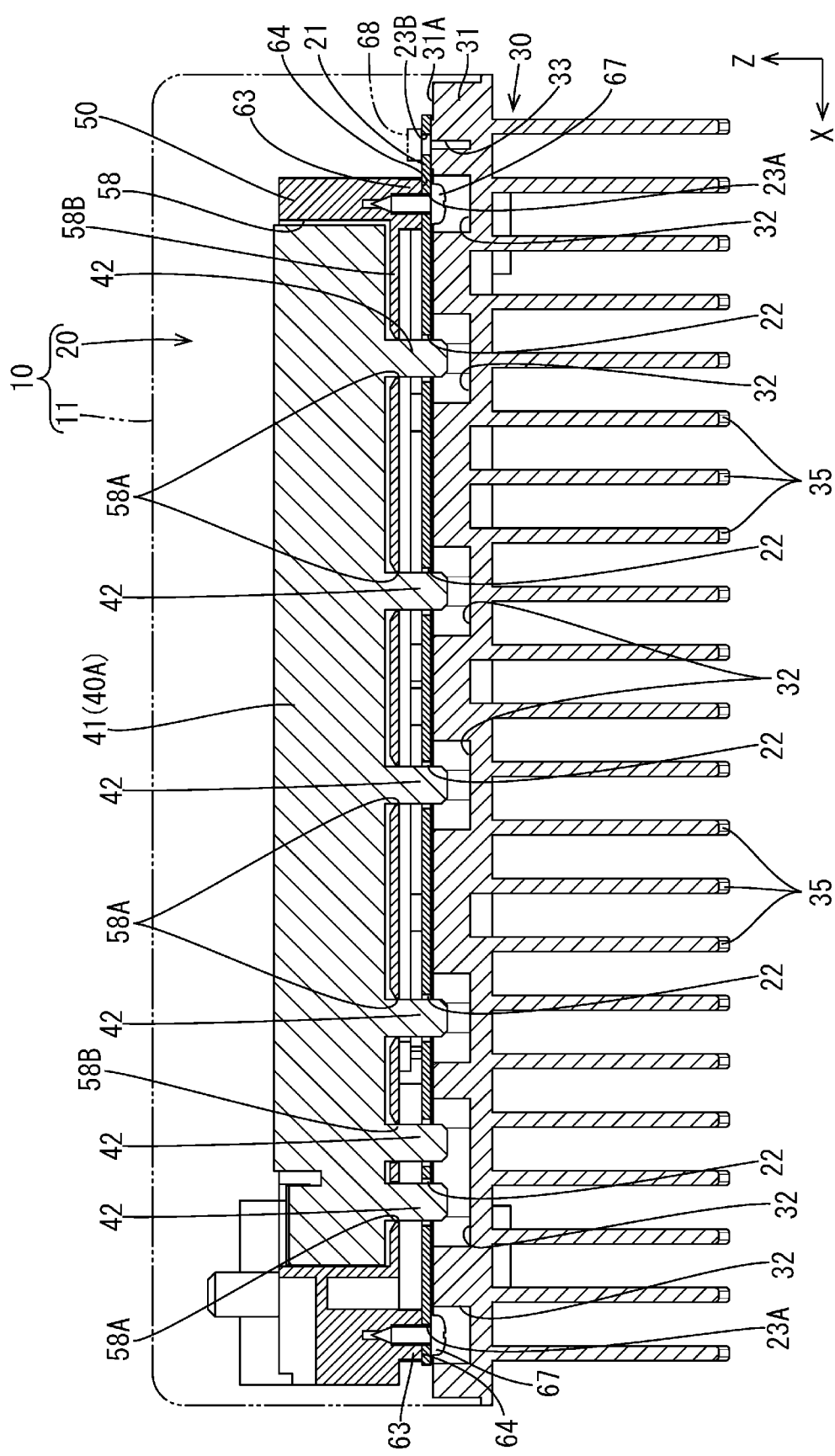
FIG. 5 is a cross-sectional view taken along a line A-A in FIG. 2.

As shown in FIG. 5, the electrical junction box 10 includes a circuit assembly 20, and a cover 11 that covers the circuit assembly 20. The cover 11 is made of a synthetic resin or metal, and has the shape of a box with its bottom open.

Circuit Assembly 20

As shown in FIGS. 1 and 5, the circuit assembly 20 includes: a substrate 21; a heat discharge member 30 that is laid on the substrate 21 from below, and discharges heat of the substrate 21 to the outside; a plurality of busbars 40A to 40C that stand on the upper side of the substrate 21 in an orientation in which their plate surfaces are orthogonal to (intersect with) a surface of the substrate 21; and a frame 50 that holds the busbars 40A to 40C.

Substrate 21

The substrate 21 is rectangular, and is a printed wiring board obtained by printing an electrically conducting path made of a copper foil or the like onto an insulating plate made of an insulating material. The substrate 21 has a plurality of through holes 22 through which connection portions 42 of the busbars 40A to 40C are inserted, and a plurality of screw holes 23A and 23B for fastening screws 67, the through holes 22 and the screw holes 23A and 23B penetrating the substrate 21. The substrate 21 is laid (stacked) over the entire top surface of the heat discharge member 30 except for the rim portion thereof, and a plurality of not-shown electronic components are mounted thereon. The plurality of electronic components include a field effect transistor (FET), a coil, a capacitor, a resistor, or the like.

Heat Discharge Member 30

The heat discharge member 30 is made of a thermally-conductive metal material such as aluminum, an aluminum alloy, copper, or a copper alloy, and includes a plate-shaped portion 31 in the shape of a plate on which the substrate 21 is mounted, and a plurality of discharge fins 35 provided side by side under the plate-shaped portion 31. The plate-shaped portion 31 has, on the upper side thereof, a planar flat surface 31A, escape recess portions 32 for prevention of contact with the connection portions 42 of the busbars 40A to 40C and with the heads of the screws 67, and screw holes 33 through which screws 68 can be screwed to the substrate 21.

Busbars 40A to 40C

The busbars 40A to 40C are all plate-shaped, are made of metal such as copper, a copper alloy, aluminum, an aluminum alloy for example, and are each formed by punching a metal plate material into a shape that conforms to that of the corresponding electrically conducting path. Each of the busbars 40A to 40C includes a body 41 that extends in the longitudinal direction in a band-shaped manner, and a plurality of connection portions 42 that protrude from one edge portion of the body 41 at a distance from each other in the longitudinal direction. The body 41 extends in the longitudinal direction with a predetermined width. The connection portions 42 are designed to be inserted into the through holes 22 formed in the substrate 21, in a state in which the frame 50 to which the busbars 40A to 40C are fixed is mounted on the substrate 21.

As shown in FIG. 1, the busbar 40A has a terminal portion 43 that can be connected to an external terminal. The terminal portion 43 has a rectangular plate shape, is contiguous with the body 41 of the busbar 40A, and is bent to extend in a direction orthogonal to the plate surface of the body 41. Furthermore, laterally to the terminal portion 43, terminal portions 44A and 44B are arranged side by side. The terminal portions 43, 44A, and 44B each have, in the center thereof, a bolt hole 45 that penetrates the corresponding terminal portion. The shafts of stud bolts 46 are inserted into the bolt holes 45, and the heads of the stud bolts 46 are fixed to the lower sides (back sides) of the terminal portions 43, 44A, and 44B by, for example, welding or the like.

Frame 50

The frame 50 is made of an insulating synthetic resin, and as the insulating synthetic resin, for example, an engineering plastic (heat resistance: 100 degrees or more, strength: 50 MPa or more, bending elastic modulus: 2.4 GPa or more) may be used but it is preferable to use a resin having high heat dissipation properties. The frame 50 includes a rectangular outer frame portion 51 that is arranged along the rim portion on the top surface of the heat discharge member 30, and an inner frame portion 56 that is coupled to the inner side of the outer frame portion 51. The outer frame portion 51 includes: a resting portion 52 on which the terminal portions 43, 44A, and 44B are placed; a pair of left and right busbar fixation frames 53A and 53B provided at positions contiguous with the rear portion of the resting portion 52; and a coupling frame 54 that couples the rear end portions of the pair of busbar fixation frames 53A and 53B. The resting portion 52 is arranged between the terminal portions 43, 44A, and 44B, and the substrate 21 so as to keep the positions of the terminal portions 43, 44A, and 44B with respect to the substrate 21, and accommodating portions (not shown) for accommodating the heads of the stud bolts 46 are recessed in the center of the mounting surfaces of the terminal portions 43, 44A, and 44B. The resting portion 52 has an insertion hole 52A, and a partition wall 52B that separates the terminal portions 43 and 44A from each other. The insertion hole 52A penetrates the resting portion 52 in an up-down direction, and a tool for fastening, with a screw, the substrate 21 to the heat discharge member 30 can be inserted thereinto.

The pair of busbar fixation frames 53A and 53B, and the inner frame portion 56 have the shape of a band whose height in the up-down direction (direction in which the substrate 21 and the frame 50 are stacked on each other) is larger, and whose thickness in the left-right direction is smaller, and respectively have groove-shaped press fit holes 58 that extend in the longitudinal direction thereof, and to which the busbars 40A to 40C are press-fitted. As shown in FIG. 5, each press fit hole 58 has, in a groove bottom 58B at the lower end thereof, a plurality of insertion holes 58A through which the connection portions 42 are inserted. A pair of groove walls (left and right groove walls arranged facing each other) of the press fit hole 58 are in intimate contact with both plate surface sides of the corresponding one of the busbars 40A to 40C over the entire length in directions in which the corresponding one of the busbars 40A to 40C extends.

Figure 6:
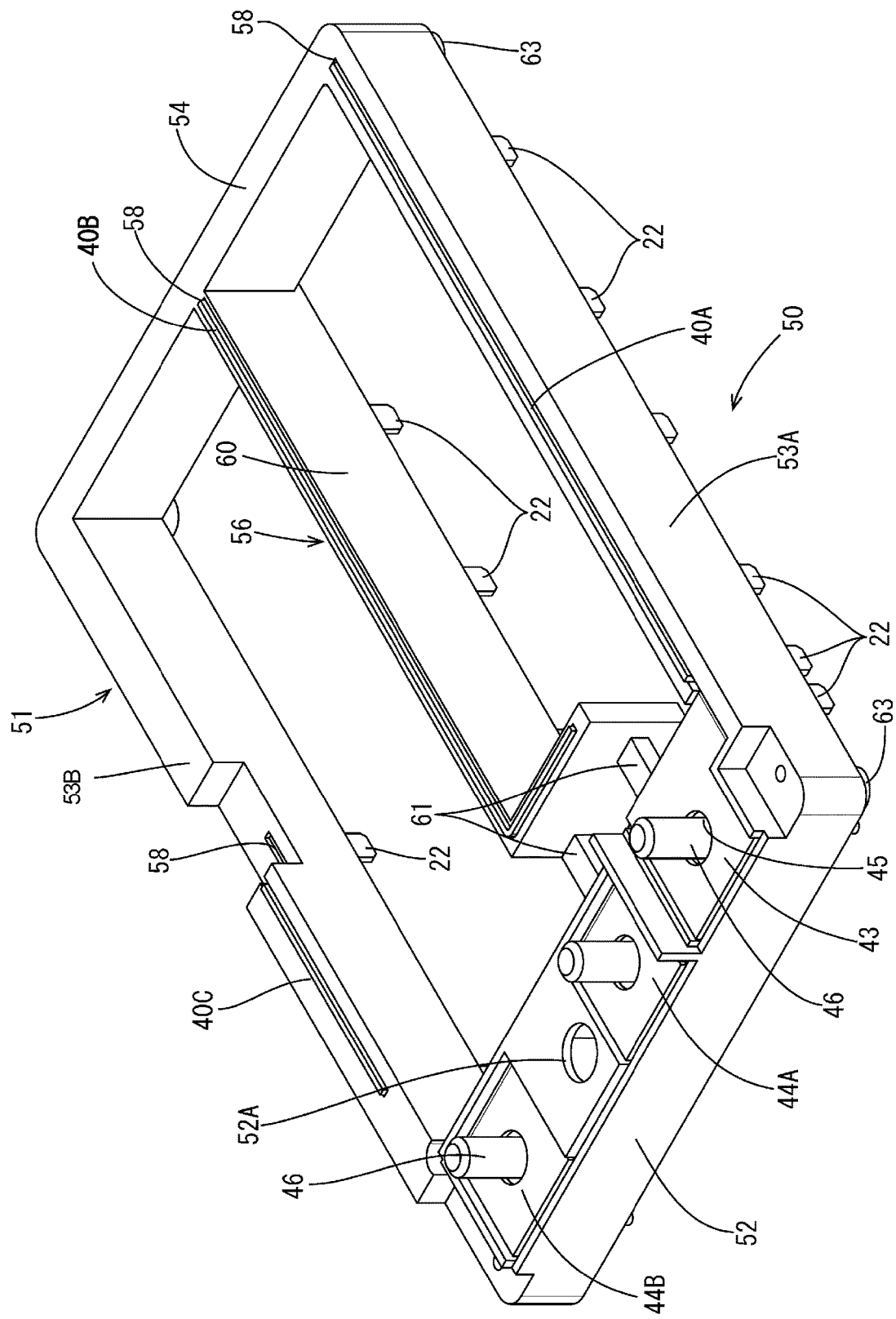
FIG. 6 is a perspective view illustrating a frame in a state in which busbars are press-fitted.

As shown in FIG. 6, the inner frame portion 56 includes: an inner frame body 60 that is bent in an L-shape, and has the press fit hole 58 into which the busbar 40B is press-fitted; and coupling portions 61 that are coupled to the resting portion 52.

The outer frame portion 51 has, in the four corners of the lower side (back side) thereof, a plurality of mounting portions 63 that are mounted on the substrate 21. The plurality of mounting portions 63 are columnar, and protrude downward (to the substrate 21 side). Note that the shape of the mounting portions 63 is not limited to the columnar shape, and the shape may also be, for example, that of a rectangular column, or an elongated shape extending in a direction in which the outer frame portion 51 extends. As shown in FIG. 5, each mounting portion 63 has, on the lower side (back side) thereof, a fastening portion 64 to which a screw 67 can be screwed from below. The fastening portion 64 has a screw hole through which the shaft of the screw 67 passed through the screw hole 23B of the substrate 21 is screwed.

Hereinafter, the assembly of the electrical junction box 10 will be described.

The busbars 40A to 40C are press-fitted into the press fit holes 58 of the frame 50. Note that, after the press-fitting of the busbars 40A to 40C, an adhesive may be applied. Then, the frame 50 with the press-fitted busbars 40A to 40C is mounted on the substrate 21, and the substrate 21 is fastened, with the screws 67, to the fastening portion 64 of the frame 50. Then, flow soldering is performed to solder the plurality of connection portions 42 inserted into the through holes 22 to the electrically conducting path of the substrate 21.

Then, the heat discharge member 30 is laid on the substrate 21 from below, and the screws 68 are passed through the screw holes 23B of the substrate 21 to fasten the substrate 21 to the heat discharge member 30, thereby forming the circuit assembly 20 (FIG. 1). Note that an insulating layer such as an adhesive may be formed between the substrate 21 and the heat discharge member 30. By covering the circuit assembly 20 with the cover 11, the electrical junction box 10 is formed (see FIG. 5).

Hereinafter, functions and effects of the present embodiment will be described.

The circuit assembly 20 includes: the substrate 21 with an electrically conducting path; the plate-shaped busbars 40A to 40C that have connection portions 42 connected to the electrically conducting path of the substrate 21, and are arranged in an orientation in which their plate surfaces intersect with a surface of the substrate 21; the heat discharge member 30 that is laid on the side of the substrate 21 opposite to the busbars 40A to 40C, and is configured to discharge heat of the substrate 21; and the frame 50 that is made of a synthetic resin, and extends along the busbars 40A to 40C to hold the busbars 40A to 40C while being in intimate contact with the busbars 40A to 40C, wherein the frame 50 includes the mounting portions 63 mounted on the substrate 21 (at least either the substrate 21 or the heat discharge member 30).

According to the present embodiment, since the busbars 40A to 40C are held by the frame 50, and the mounting portions 63 of the frame 50 are mounted on the substrate 21, stress due to vibration of the vehicle or the like is less likely to affect the connection portions 42 of the busbars 40A to 40C. Accordingly, it is possible to suppress a reduction in connection reliability of a connection between the electrically conducting path of the substrate 21 and the busbars 40A to 40C. Furthermore, the plate surfaces of the busbars 40A to 40C are arranged in an orientation in which they are orthogonal to (intersect with) the surface of the substrate 21, and thus it is possible to reduce the area of the substrate 21 covered by the busbars 40A to 40C. This allows an enlarged area of the substrate 21 on which electronic components can be mounted, making it possible to achieve a downsized circuit assembly 20. Furthermore, heat of the busbars 40A to 40C can be discharged from the frame 50 to the outside, and thus it is possible to improve the discharge properties.

Furthermore, the frame 50 includes the outer frame portion 51 that is arranged along the rim portion of the heat discharge member 30, and the busbars 40A to 40C are held by the outer frame portion 51.

With this measure, heat of the busbars 40A to 40C can be discharged from the outer frame portion 51 to the outside.

Furthermore, the substrate 21 is a printed wiring board, and the printed wiring board is laid on the heat discharge member 30.

With this measure, it is possible to directly transfer heat of the substrate 21 to the heat discharge member 30, compared to a configuration in which the busbars 40A to 40C are arranged between the substrate 21 and the heat discharge member 30.

Furthermore, the mounting portions 63 are mounted on the substrate 21, and each have a fastening portion 64 that is fastened, with a screw 67, to the substrate 21.

With this measure, the configuration of the mounting portions 63 can be used to fasten, with the screws, the substrate 21 to the heat discharge member 30.

The busbar 40A has the terminal portion 43 that is connectable to an external terminal, and the frame 50 has the resting portion 52 on which the terminal portion 43 is placed.

With this measure, the frame 50 can absorb a torque occurring when connecting an external terminal to the terminal portion 43.

The terminal portion 43 has a plate surface that extends along the surface of the substrate 21, and the resting portion 52 is arranged between the terminal portion 43 and the substrate 21.

With this measure, the terminal portion 43 can be arranged in a region above the substrate 21, thus making it possible to realize a downsized circuit assembly 20, compared to a configuration in which the terminal portion 43 is arranged outside the region of the substrate 21.

Embodiment 2

Hereinafter, Embodiment 2 will be described with reference to FIGS. 7 to 10. In the circuit assembly 20 of Embodiment 1, the busbars 40A to 40C are press-fitted into the press fit holes 58 of the frame 50, while an electrical junction box 69 according to Embodiment 2 has a configuration in which busbars 40A to 40C, and a frame 70 are integrated into one piece by insert molding. Hereinafter, because other structures are the same as those of Embodiment 1, the same reference numerals are given to the same structures as those of Embodiment 1, and description thereof is omitted.

Frame 70

Figure 7:
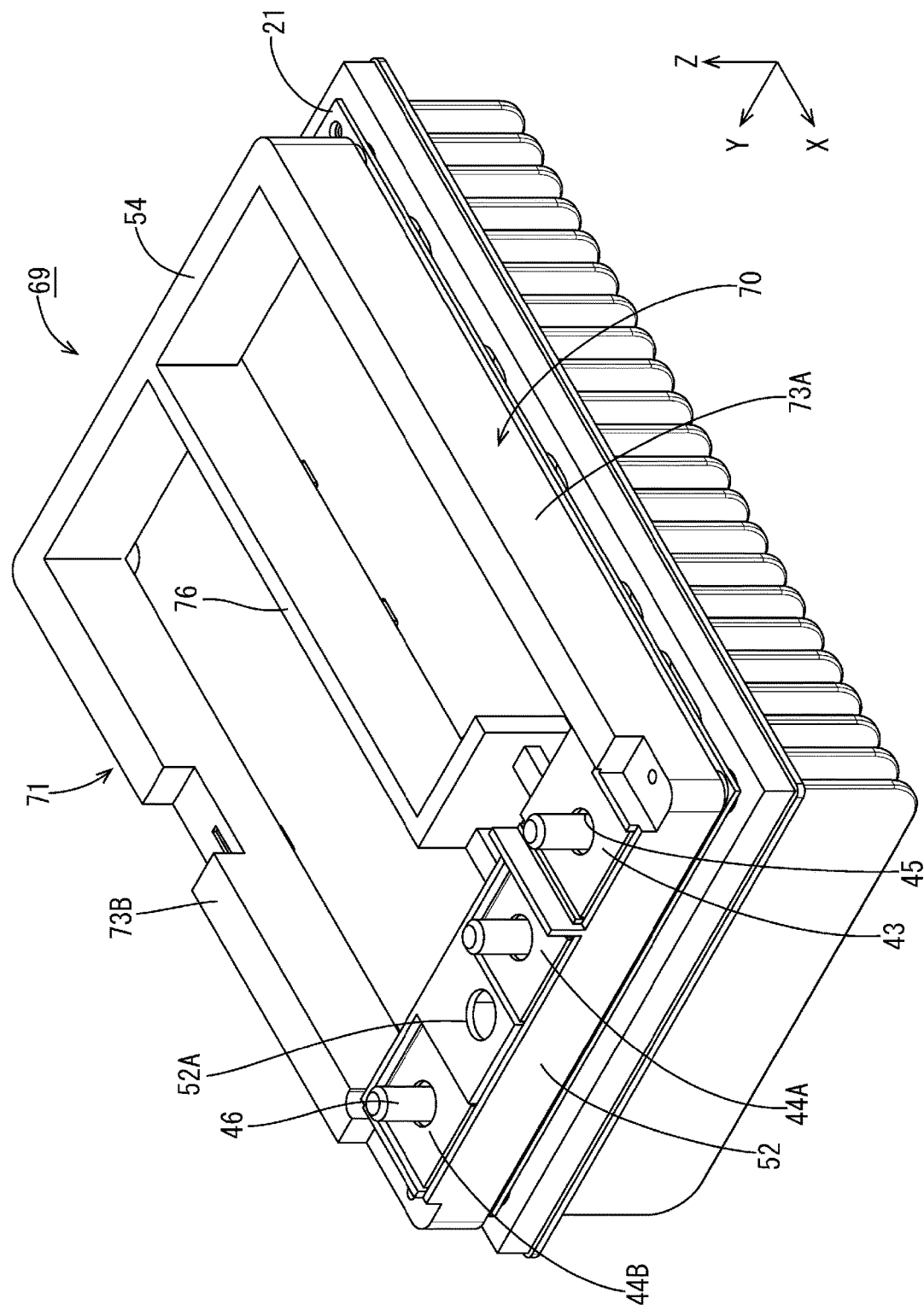
FIG. 7 is a perspective view illustrating a circuit assembly according to Embodiment 2.
Figure 8:
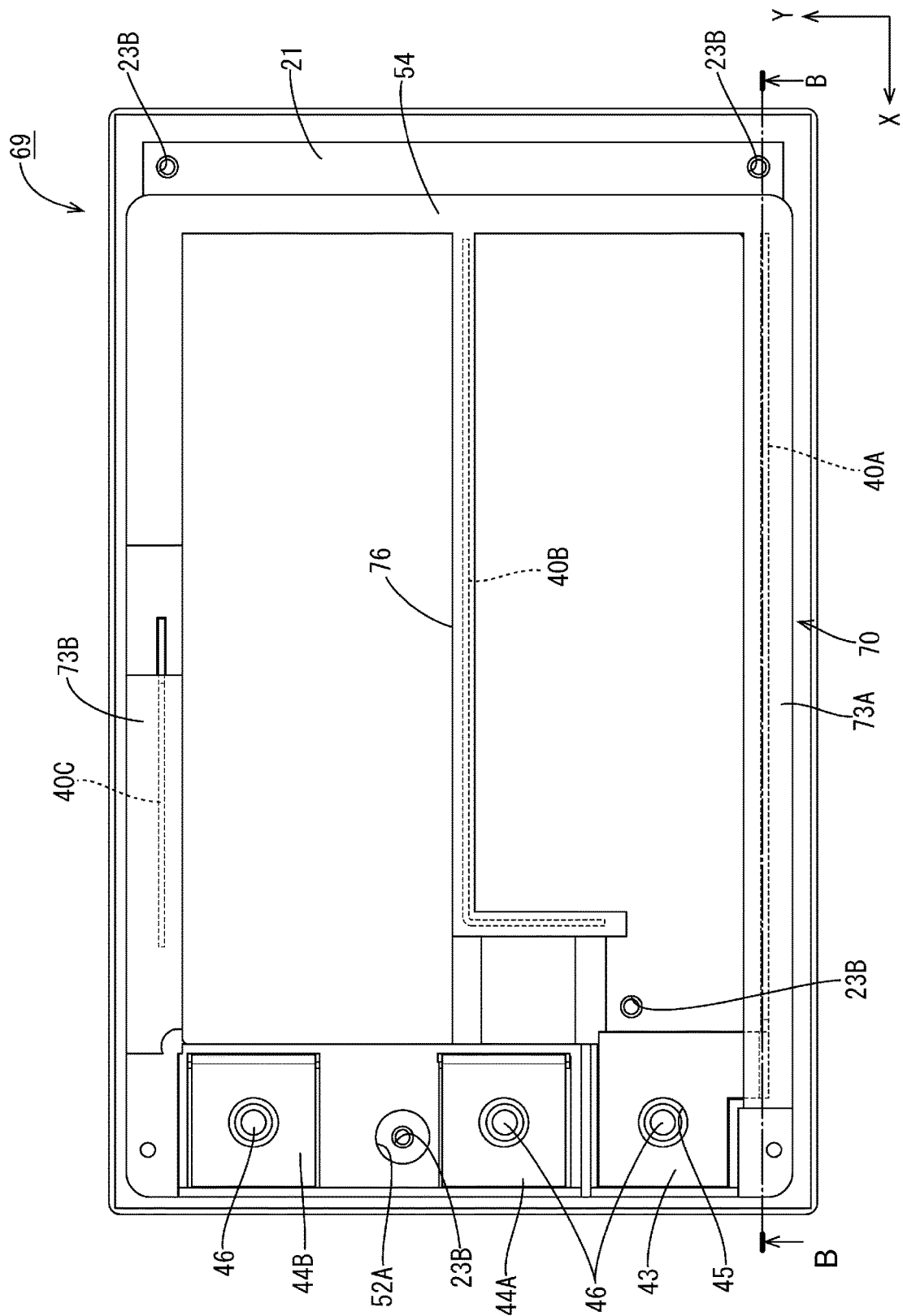
FIG. 8 is a plan view illustrating the circuit assembly.

The frame 70 is made of an insulating synthetic resin, and includes, as shown in FIG. 7, a rectangular outer frame portion 71 that is arranged along the rim portion of the top surface of a heat discharge member 30, and an inner frame portion 76 that is coupled to the inner side of the outer frame portion 71. The outer frame portion 71 includes: a resting portion 52 on which terminal portions 43, 44A, and 44B are placed; a pair of left and right busbar fixation frames 73A and 73B provided at positions contiguous with the rear portion of the resting portion 52; and a coupling frame 54 that couples rear end portions of the pair of busbar fixation frames 73A and 73B.

Figure 9:
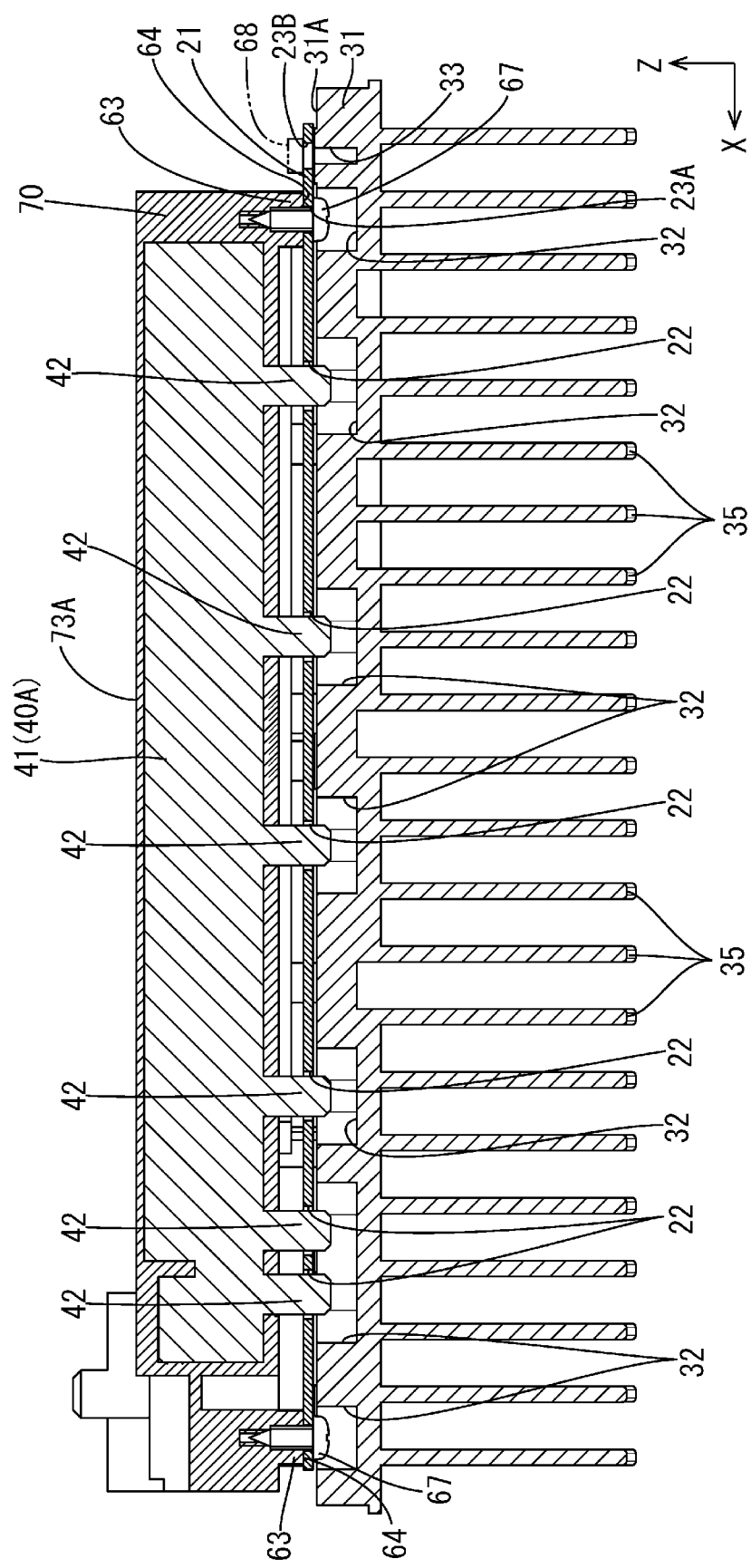
FIG. 9 is a cross-sectional view taken along a line B-B in FIG. 8.
Figure 10:
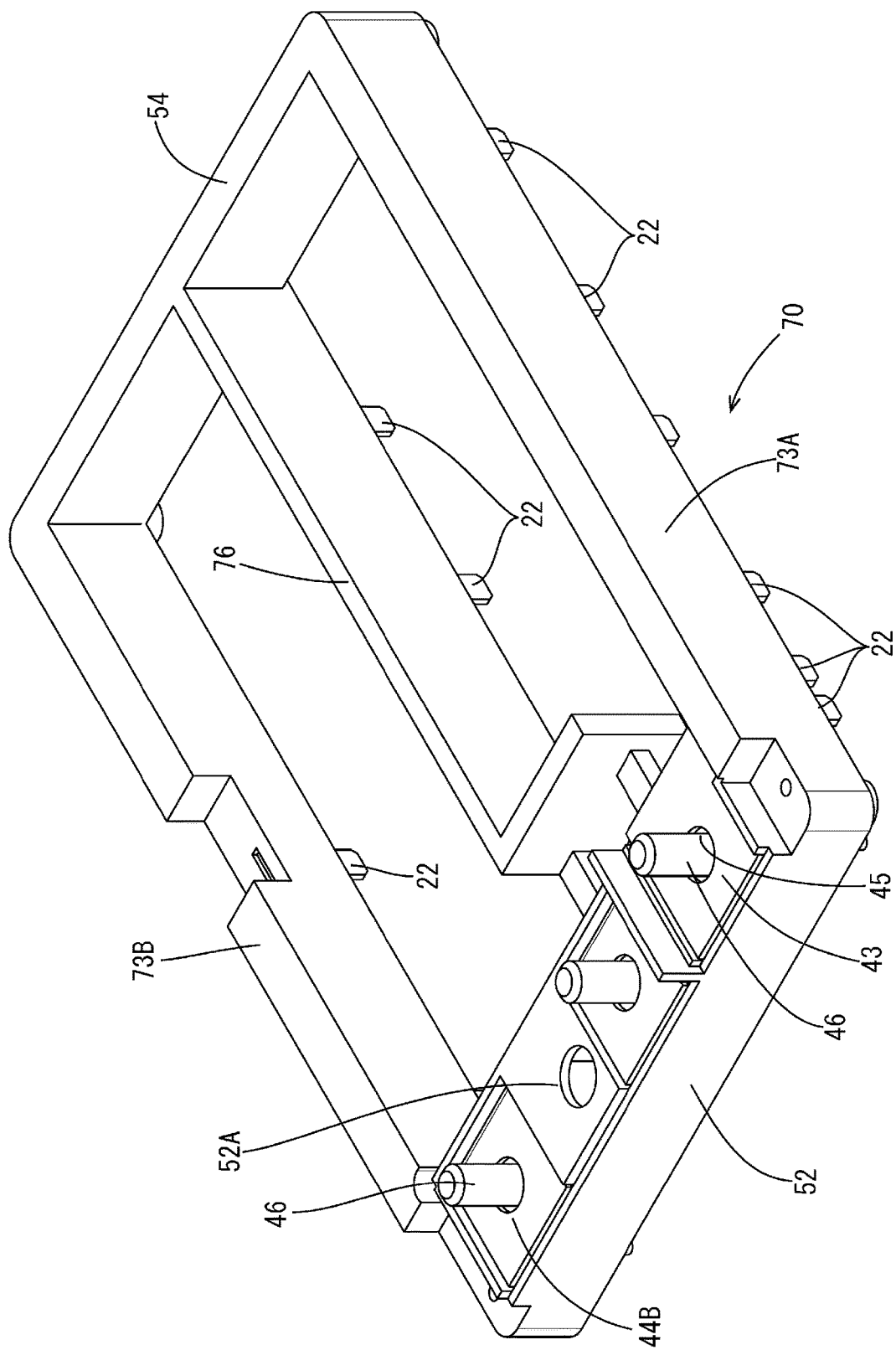
FIG. 10 is a perspective view illustrating a frame in which busbars and a synthetic resin are integrated into one piece by insert molding.

The pair of busbar fixation frames 73A and 73B, and the inner frame portion 76 have the shape of a band whose height in the up-down direction is larger, and whose thickness in the left-right direction is smaller. As shown in FIG. 9, the bodies 41 of the busbars 40A to 40C are embedded inside the busbar fixation frames 73A, 73B and the inner frame portion 76, and the connection portions 42 are exposed to the outside from the lower end portions of the busbar fixation frames 73A, 73B and the inner frame portion 76. The portions of the busbars 40A to 40C that are embedded inside the busbar fixation frames 73A, 73B and the inner frame portion 76 are entirely in intimate contact with a synthetic resin of the busbar fixation frames 73A, 73B and the inner frame portion 76.

Other Embodiments

The technique disclosed in the present description is not limited to the embodiments described in the above description with reference to the drawings, and the technical scope of the technique disclosed in the present description encompasses, for example, the following embodiments.

Although the above-described embodiments have a configuration in which the mounting portions 63 of the frame 50, 70 are mounted on the substrate 21, the present invention is not limited to this, and a configuration is also possible in which the mounting portions 63 are mounted on the top surface of the heat discharge member 30. Also, the present invention is not limited to the configuration in which the plurality of mounting portions 63 are mounted on either the substrate 21 or the heat discharge member 30, and the plurality of mounting portions 63 may also be mounted on both the substrate 21 and the heat discharge member 30.

Although the plate surfaces of the busbars 40A to 40C are set in an orientation in which they are orthogonal to a surface of the substrate 21, the present invention is not limited to this, and a configuration is also possible in which the plate surfaces of the busbars 40A to 40C are arranged in an orientation in which they intersect with the surface of the substrate 21 not orthogonally but at an angle.

The invention claimed is:

1. A circuit assembly comprising:
   a substrate with an electrically conducting path;
   a plurality of plate-shaped busbars that each have a connection portion connected to the electrically conducting path of the substrate, and are arranged in an orientation in which plate surfaces of the plate-shaped busbars intersect with a surface of the substrate;
   a heat discharge member that is laid on a side of the substrate opposite to the busbars, and is configured to discharge heat of the substrate; and
   a resin frame that extends along the plurality of busbars, and holds the plurality of busbars while being in intimate contact with the plurality of busbars,
   wherein the frame includes an outer frame portion that holds the busbars while being in intimate contact with the busbars, and an inner frame portion that is coupled to the inner side of the outer frame portion, and holds another busbar different from the busbars held by the outer frame portion while being in intimate contact with the other busbar, and
   the outer frame portion includes a mounting portion mounted on at least either the substrate or the heat discharge member.

2. The circuit assembly according to claim 1,
   wherein the frame includes the outer frame portion that is arranged along a rim portion of the heat discharge member, and
   the busbars are held by the outer frame portion.

3. The circuit assembly according to claim 2,
   wherein the substrate is a printed wiring board, and
   the printed wiring board is laid on the heat discharge member.

4. The circuit assembly according to claim 2, wherein the mounting portion is mounted on the substrate, and has a fastening portion that is fastened, with a screw, to the substrate.

5. The circuit assembly according to claim 1,
   wherein the substrate is a printed wiring board, and
   the printed wiring board is laid on the heat discharge member.

6. The circuit assembly according to claim 5, wherein the mounting portion is mounted on the substrate, and has a fastening portion that is fastened, with a screw, to the substrate.

7. The circuit assembly according to claim 1, wherein the mounting portion is mounted on the substrate, and has a fastening portion that is fastened, with a screw, to the substrate.

8. An electrical junction box comprising:
   the circuit assembly according to claim 1; and
   a cover that covers the circuit assembly.

9. The electrical junction box as set forth in claim 8, wherein the frame of the circuit assembly includes the outer frame portion that is arranged along a rim portion of the heat discharge member, and the busbars are held by the outer frame portion.

10. The electrical junction box as set forth in claim 8, wherein the substrate of the circuit assembly is a printed wiring board, and the printed wiring board is laid on the heat discharge member.

11. The electrical junction box as set forth in claim 8, wherein the mounting portion is mounted on the substrate, and has a fastening portion that is fastened, with a screw, to the substrate.

* * * * *